(12) United States Patent
Tanemura et al.

(10) Patent No.: US 11,825,267 B2
(45) Date of Patent: Nov. 21, 2023

(54) MICROPHONE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Tomoki Tanemura, Nisshin (JP); Hideyuki Nagai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 17/583,749

(22) Filed: Jan. 25, 2022

(65) Prior Publication Data
US 2022/0377466 A1 Nov. 24, 2022

(30) Foreign Application Priority Data
May 21, 2021 (JP) ................................ 2021-086362

(51) Int. Cl.
*H04R 19/04* (2006.01)
*H03G 5/16* (2006.01)
*H04R 3/04* (2006.01)
*H04R 19/00* (2006.01)

(52) U.S. Cl.
CPC ............. *H04R 19/04* (2013.01); *H03G 5/165* (2013.01); *H04R 3/04* (2013.01); *H04R 19/005* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 2012/0308047 A1* | 12/2012 | Muza | H04R 29/004 381/111 |
| 2018/0034434 A1 | 2/2018 | Fukue et al. | |
| 2019/0230446 A1* | 7/2019 | Schultz | H04R 19/04 |
| 2021/0014609 A1 | 1/2021 | Ishizuka et al. | |

FOREIGN PATENT DOCUMENTS

| | | |
|---|---|---|
| JP | 2008-268257 A | 11/2008 |
| JP | 2012-134842 A | 7/2012 |
| JP | 2012-195813 A | 10/2012 |
| JP | 2019-086724 A | 6/2019 |

* cited by examiner

*Primary Examiner* — Kenny H Truong
(74) *Attorney, Agent, or Firm* — POSZ LAW GROUP, PLC (57) ABSTRACT

A microphone has a MEMS device, a driver, and a control unit. The MEMS device outputs a first electrical signal according to an acoustic pressure. The driver vibrates the MEMS device by a drive signal. The control unit calculates a correction value for correcting the first electric signal based on a second electric signal output from the MEMS device when the MEMS device is vibrated by the drive signal.

13 Claims, 10 Drawing Sheets

MICROPHONE

CROSS REFERENCE TO RELATED APPLICATION

This application is based on Japanese patent application No. 2021-86362 filed on May 21, 2021, the entire content of which is incorporated herein by reference.

TECHNICAL FIELD

The present disclosure relates to a microphone.

BACKGROUND

An acoustic characteristic correction system having an equalizing process unit for sound emission and a CPU is known.

An object of the present disclosure is to provide a microphone capable of setting a correction value without a sound source.

SUMMARY

A microphone according to one aspect of the present disclosure includes a vibration device that outputs a first electric signal corresponding to an acoustic pressure, a drive unit that vibrates the vibration device by a drive signal, and a correction unit that calculates a correction value for correcting the first electric signal based on a second electric signal output from the vibration device when vibrating the vibration device by the drive signal.

DETAILED DESCRIPTION

In an assumable example, an acoustic characteristic correction system having an equalizing process unit for sound emission and a CPU is known. The equalizing process unit for sound emission corrects a sound collection signal picked up by a microphone. The CPU sets a correction parameter of the equalizing process unit for sound emission based on a sound characteristic measurement signal emitted from a speaker and a desired acoustic characteristic stored in the memory.

In the acoustic characteristic correction system described above, a test sound source for emitting sound from the speaker is required when setting a correction parameter. The correction parameter (correction value) could not be set without the test sound source (sound source).

An object of the present disclosure is to provide a microphone capable of setting a correction value without a sound source.

A microphone according to one aspect of the present disclosure includes a vibration device that outputs a first electric signal corresponding to an acoustic pressure, a drive unit that vibrates the vibration device by a drive signal, and a correction unit that calculates a correction value for correcting the first electric signal based on a second electric signal output from the vibration device when vibrating the vibration device by the drive signal.

According to this configuration, the correction value can be calculated even if there is no sound source. Moreover, the correction value does not depend on the characteristics of the sound source.

The following will describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each form, the other forms described above can be applied to the other parts of the configuration. When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

A piezoelectric MEMS microphone will be described with reference to FIGS. 1 to 9.

<Piezoelectric MEMS Microphone>

Figure 1:
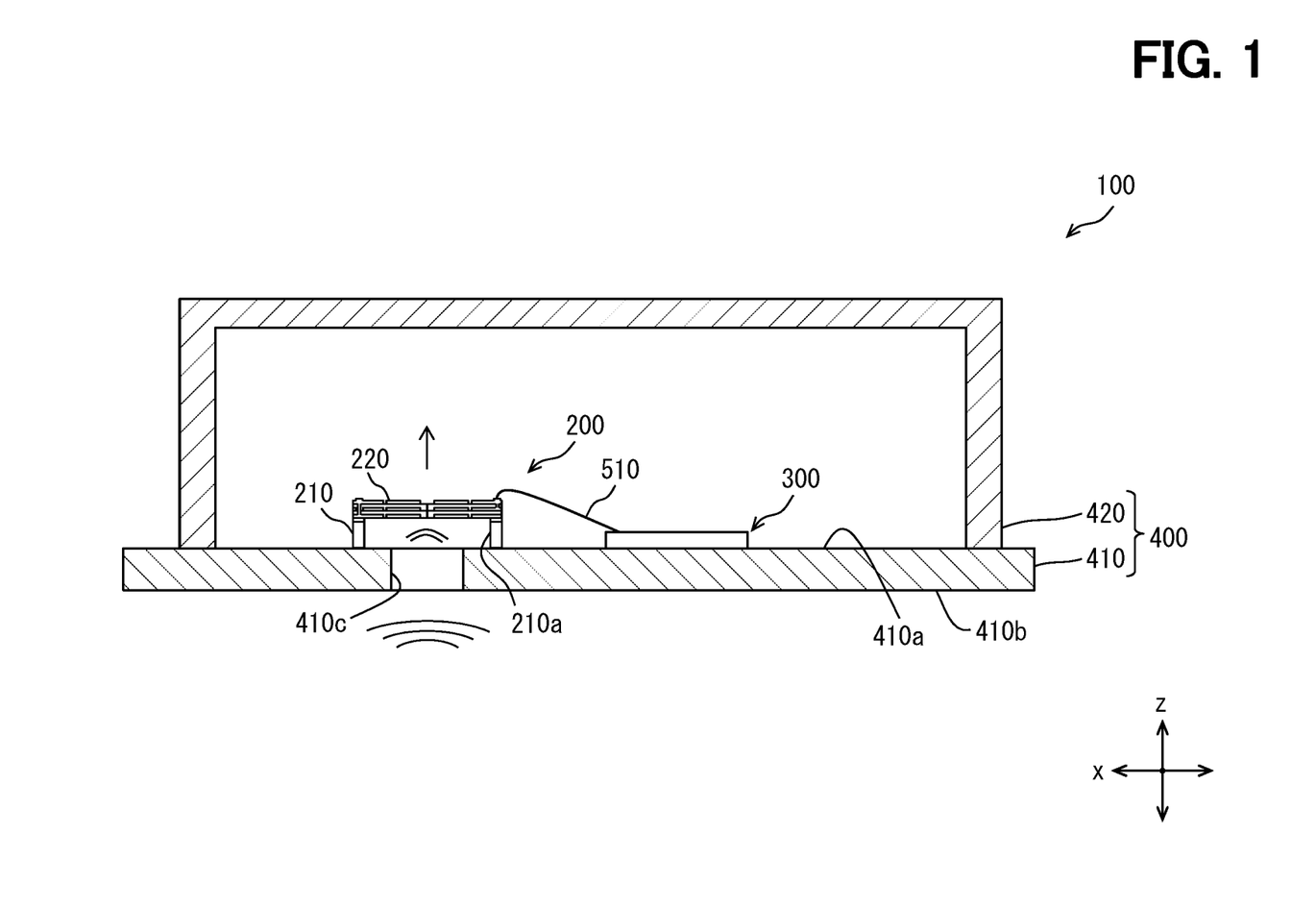
FIG. 1 is a sectional view showing a schematic configuration of a piezoelectric MEMS microphone.

As shown in FIG. 1, the piezoelectric MEMS microphone 100 has a MEMS device 200, an ASIC 300, and a package 400. The MEMS is an abbreviation for Micro Electro Mechanical System. The ASIC is an abbreviation of Application Specific Integrated Circuit.

The MEMS device 200 and the ASIC 300 are electrically connected. A package 400 has a substrate 410 and a lid 420. Each of the MEMS device 200 and the ASIC 300 is mounted on an inner surface 410a of the substrate 410. The inner surface 410a is covered with the lid 420. The MEMS device 200 and the ASIC 300 are housed in an internal space of the package 400 composed of the substrate 410 and the lid 420.

An introduction hole 410c is provided in the substrate 410 so as to penetrate through the inner surface 410a and an outer surface 410b on the back side of the substrate 410. The introduction hole 410c communicates the internal space of the package 400 with an external space outside the package 400. The MEMS device 200 covers an opening on the internal space side of the introduction hole 410c.

Due to this configuration, when air vibration (sound) is generated in the external space, the vibration acts on the MEMS device 200 as acoustic pressure. The MEMS device 200 outputs an electric signal corresponding to the acoustic pressure to the ASIC 300. As a result, the sound generated in the external space is detected.

<MEMS Device>

Hereinafter, the MEMS device 200 will be described in detail. Hereinafter, three directions orthogonal to each other are referred to as an x-direction, a y-direction, and a z-direction. In the drawing, the description of "direction" is omitted, and it is simply expressed as x, y, z.

Figure 2:
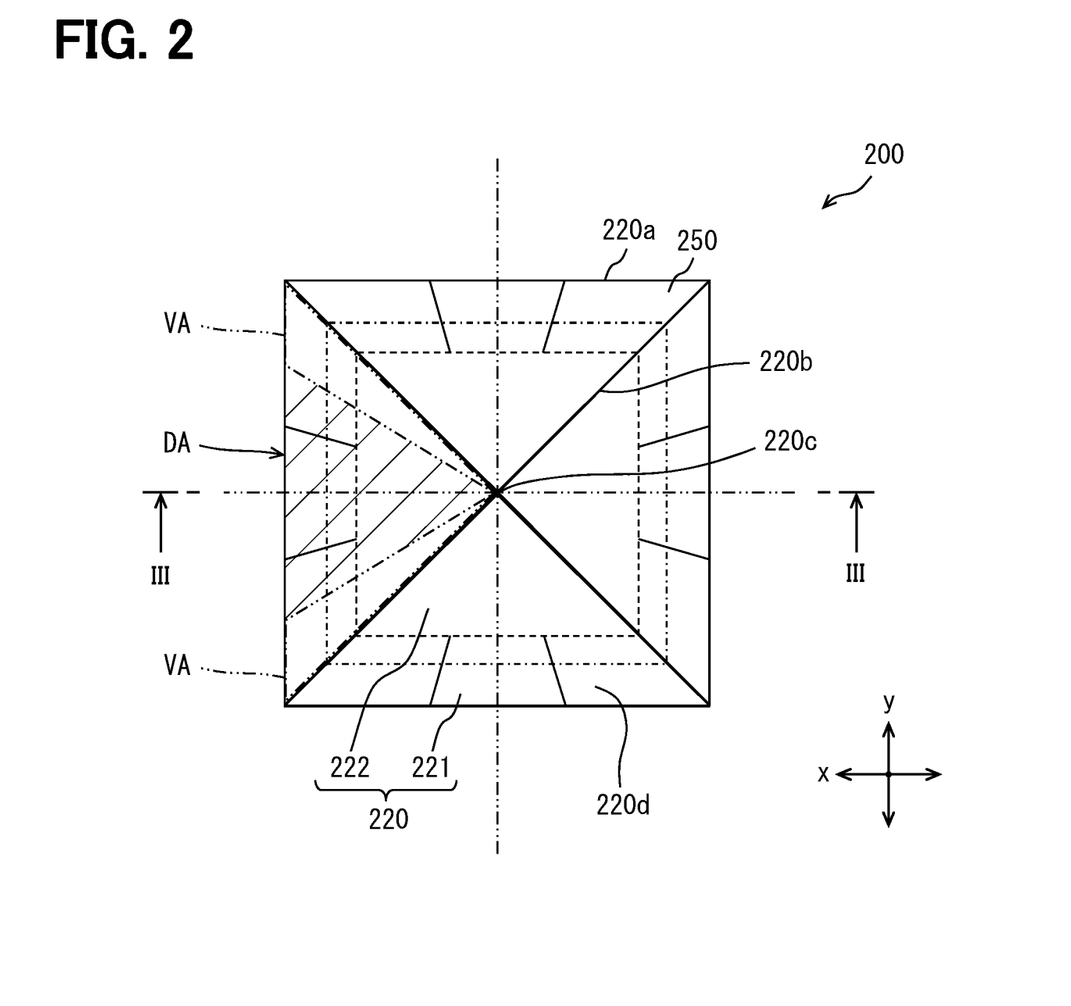
FIG. 2 is a top view of a MEMS device.
Figure 3:
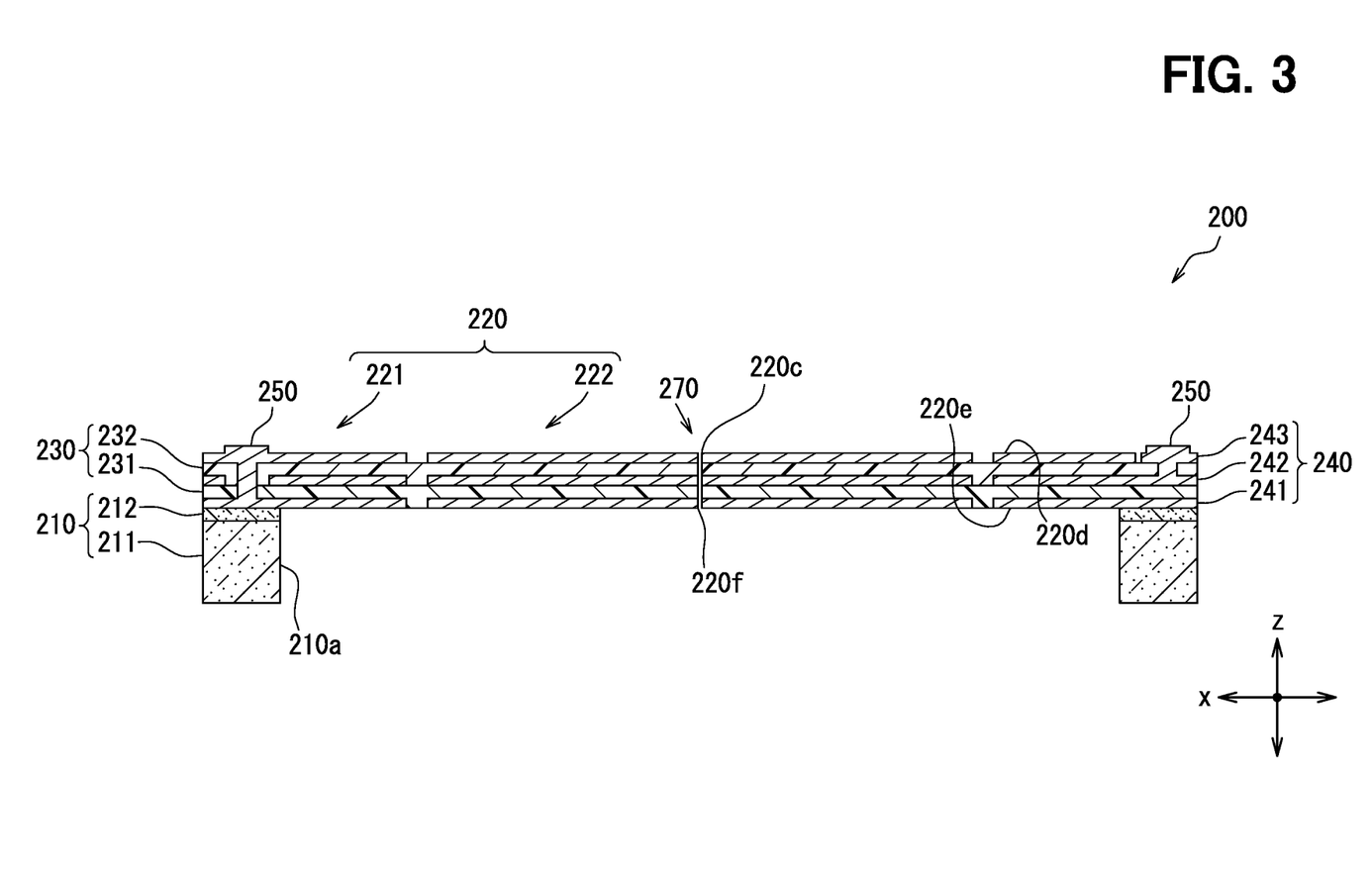
FIG. 3 is a sectional view taken along a line III-Ill of FIG. 2.

As shown in FIGS. 2 and 3, the MEMS device 200 has a support base 210 and a vibrator 220. The vibrator 220 is integrally connected to the support base 210.

<Support Base>

The support base 210 has a base portion 211 and a design layer 212 laminated in the z direction. The base portion 211 is made of silicon. The design layer 212 is made of silicon oxide.

The base portion 211 and the design layer 212 are integrally connected. Each of the base portion 211 and the design layer 212 has an opening hole 210a that opens in the z direction. Each of the base portion 211 and the design layer 212 forms an annular shape in a circumferential direction around the z direction.

<Vibrator>

The MEMS device 200 has a plurality of vibrators 220. Each of these plurality of vibrators 220 is integrally connected to the design layer 212 of the support base 210. The plurality of vibrators 220 are cantilevered and supported by the design layer 212. The plurality of vibrators 220 cover the opening of the opening hole 210a on the design layer 212 side.

As shown in FIG. 2, one vibrator 220 forms a triangle in a plane orthogonal to the z direction. A lower side 220a side of one of the three sides of the vibrator 220 is fixed to the support base 210. The remaining two hypotenuses 220b extend apart from the lower side 220a and then intersect to form the tip 220c. The tip 220c side of the vibrator 220 is released from the support base 210.

In the following, for the sake of simplicity, the lower side 220a side of the vibrator 220 is referred to as a support end portion 221 and the tip 220c side is referred to as an open end portion 222. A direction in which the support end portion 221 and the open end portion 222 are lined up is referred to as an extension direction.

The vibrator 220 extends in the extension direction. The vibrator 220 becomes tapered as it moves away from the support base 210. The support end portion 221 on the lower side 220a side of the vibrator 220 forms trapezoidal in a plane orthogonal to the z direction. The open end portion 222 on the tip 220c side of the vibrator 220 forms a triangle in a plane orthogonal to the z direction.

The lower side of the support end portion 221 forming trapezoidal is located in a projection region of the support base 210 in the z direction. The upper side of the support end portion 221 is located in a projection region of the opening hole 210a in the z direction. In FIG. 2, a boundary between a portion of the vibrator 220 located in the projection region of the support base 210 in the z direction and a portion of the vibrator 220 located in the projection region of the opening hole 210a is shown by a alternate long and short dash line. This alternate long and short dash line is located between the lower side and the upper side of the support end portion 221.

The open end portion 222 is integrally connected to the upper side of the support end portion 221. The open end portion 222 is located in the projection region of the opening hole 210a in the z direction together with the upper side of the support end portion 221. In FIG. 2, the boundary between the support end portion 221 and the open end portion 222 is shown by a broken line.

<Gap>

As shown in FIG. 2, the MEMS device 200 has four vibrators 220. These four vibrators 220 are arranged in order in the circumferential direction around the z direction. In two vibrators 220 arranged side by side in the circumferential direction, one of the two hypotenuses 220b included in the vibrator 220 and one of the two hypotenuses 220b included in the other vibrator 220 face each other in the circumferential direction with a minute gap. The gap is open on an upper surface 220d side and a lower surface 220e side, which are apart from each other in the z direction of the vibrator 220.

The gaps between the hypotenuses 220b of each of the four vibrators 220 arranged in the circumferential direction are indicated by a cross mark in a plane orthogonal to the z direction. A center point of the MEMS device 200 is located on a central axis passing through the center of the gap forming the cross mark in the z direction. In FIG. 2, two guide lines passing through the center of the cross mark are shown by a two-dot chain line. One of the two guide lines is along the x direction and the other is along the y direction.

<Vibration Due to Acoustic Pressure>

As shown in FIGS. 1 and 3, the portions of the support end portion 221 and the open end portion 222 of the vibrator 220 located in the projection region of the opening hole 210a in the z direction covers the opening hole 210a on the design layer 212 side. The portions of the support end portion 221 and the open end portion 222 located in the projection region of the opening hole 210a in the z direction and the portion of the support base 210 for partitioning the opening hole 210a covers the opening of the an introduction hole 410c on the internal space side.

Due to this configuration, when sound is generated in the external space, the air in the opening hole 210a vibrates due to the sound. The vibration of the air acts on the vibrator 220 as acoustic pressure. As a result, the support end portion 221 and the open end portion 222 of the vibrator 220 vibrate respectively. Deflection occurs in the support end portion 221 and the open end portion 222.

A part of the acoustic pressure escapes to the internal space of the package 400 through the above-mentioned gap. Due to this configuration, if the gap is wider than a design value, the acoustic pressure is likely to escape into the internal space of the package 400. The acoustic pressure makes it difficult for the vibrator 220 to vibrate. The gap is made small in order to avoid such a defect.

<Material>

The vibrator 220 includes a piezoelectric element that converts pressure into voltage. As shown in FIG. 3, the vibrator 220 has a piezoelectric layer 230 and an electrode layer 240. The piezoelectric layer 230 and the electrode layer 240 are laminated in the z direction.

The piezoelectric layer 230 contains a material having a higher piezoelectric constant than aluminum nitride (AlN). Examples of the material (piezoelectric material) contained in the piezoelectric layer 230 include scandium aluminum nitride (ScAlN), lead zirconate titanate (PZT), and sodium potassium niobate (KNN). The electrode layer 240 contains a conductive material such as molybdenum.

The piezoelectric layer 230 has a first piezoelectric layer 231 and a second piezoelectric layer 232. The electrode layer 240 has a first electrode layer 241, a second electrode layer 242, and a third electrode layer 243.

As shown in FIG. 3, the first electrode layer 241, the first piezoelectric layer 231 and the second electrode layer 242, the second piezoelectric layer 232, and the third electrode layer 243 are sequentially laminated in the z direction. The first electrode layer 241 is connected to the support base 210. The first electrode layer 241 is located on the lower surface 220e side of the vibrator 220. The third electrode layer 243 is located on the upper surface 220d side of the vibrator 220.

A lower layer capacitor is formed by arranging the first electrode layer 241 and the second electrode layer 242 in the z direction via the first piezoelectric layer 231. An upper layer capacitor is formed by arranging the second electrode layer 242 and the third electrode layer 243 in the z direction via the second piezoelectric layer 232.

These two capacitors include the second electrode layer 242 as a common component. Through this common component, the two capacitors are electrically connected in series in the z direction. The MEMS device 200 includes a plurality of composite capacitors composed of these two electrically connected capacitors in series.

<Extraction Electrode>

A plurality of extraction electrodes 250 are formed on the support end portion 221 of the vibrator 220 so as to electrically connect each of the plurality of composite capacitors in series and detect the voltage of the plurality of electrically connected composite capacitors.

A part of the plurality of extraction electrodes 250 electrically connects the second electrode layer 242 of one of two electrically connected composite capacitors to the other first electrode layer 241 and the third electrode layer 243, respectively.

One of the remaining two extraction electrodes 250 is electrically connected to each of the first electrode layer 241 and the third electrode layer 243 of the composite capacitor that is potentially located at the lowest potential. The first electrode layer 241 and the third electrode layer 243 are connected to the ground. The last one extraction electrode 250 is connected to the second electrode layer 242 of the composite capacitor which is potentially located at the highest potential.

Each of the remaining two extraction electrodes 250 is connected to the ASIC 300 via a wire 510. As a result, both ends of the plurality of electrically connected composite capacitors are connected to the ASIC 300.

<Detection of Acoustic Pressure>

When the acoustic pressure acts, the vibrator 220 vibrates in the z direction. A tensile stress acts on one of the first piezoelectric layer 231 and the second piezoelectric layer 232 of the vibrator 220, and a compressive stress acts on the other.

Due to this difference in the acting stress, voltages having different polarities are generated in the first piezoelectric layer 231 and the second piezoelectric layer 232. This voltage is generated in the electrode layer 240 of the composite capacitor. The combined voltage generated by each of the plurality of composite capacitors is generated in the MEMS device 200. A change in capacitance of the plurality of composite capacitors or a change in charge of the plurality of composite capacitors according to this voltage is output to the ASIC 300 as a first electric signal. In the following, for the sake of simplicity, a plurality of electrically connected composite capacitors will be simply referred to as capacitors, if necessary.

<Detection Area and Vibration Area>

The vibrator 220 of the present embodiment has a detection region DA that generates a voltage by vibration due to the action of acoustic pressure, and a vibration region VA that is forcibly vibrated by input of a drive signal described later. In FIG. 2, the detection region DA is shown by hatching on one of the four vibrators 220. The vibration region VA is shown by being surrounded by a two-dot chain line.

The detection region DA is located on the center side of the vibrator 220. The vibration region VA is located on the end side of the vibrator 220. One detection region DA is located between the two vibration regions VA. One vibration region VA includes one hypotenuse 220b. In addition, unlike the present embodiment, it is also possible to adopt a configuration in which the detection region DA is located on the end side of the vibrator 220 and the vibration region VA is located on the center side of the vibrator 220.

The detection region DA and the vibration region VA are electrically isolated. Although not shown, a drive electrode for electrically connecting the electrode layer 240 of the capacitor included in the vibration region VA and the ASIC 300 with a wire 510 or the like is formed in the vibrator 220. A drive signal described later is input to this drive electrode. The MEMS device 200 corresponds to a vibration device. The detection area DA corresponds to a first detection unit. The vibration region VA corresponds to a second detection unit.

As described in the present embodiment, the vibrator 220 does not have to be divided into the detection region DA and the vibration region VA. In the case of this configuration, the drive electrode is not formed on the vibrator 220. The drive signal is input to the extraction electrode 250. The case where the voltage is generated by the vibration due to the action of the acoustic pressure and the case where the voltage is forcibly vibrated by the input of the drive signal are executed with a time lag.

In the modified example, when the correction process described later is executed, the drive signal is not input from the ASIC 300 to the extraction electrode 250. When the correction value calculation process described later is executed, the drive signal is input from the ASIC 300 to the extraction electrode 250.

<Equivalent Circuit>

As described above, when sound is generated in the external space, the air in the opening hole 210a vibrates. The vibrator 220 vibrates due to the vibration of the air. As a result, a voltage is generated in the vibrator 220.

In this way, in the conversion of the sound generated in the external space into an electric signal, three things are related: the easiness of vibration of the air in the opening hole 210a, the easiness of vibration of the vibrator 220, and the voltage conversion in the vibrator 220. The easiness of vibration of the air in the opening hole 210a is obtained by the fluid mechanics. The easiness of vibration of the vibrator 220 is obtained by the mechanical mechanics. The voltage conversion in the vibrator 220 is obtained by the electromagnetism.

Figure 4:
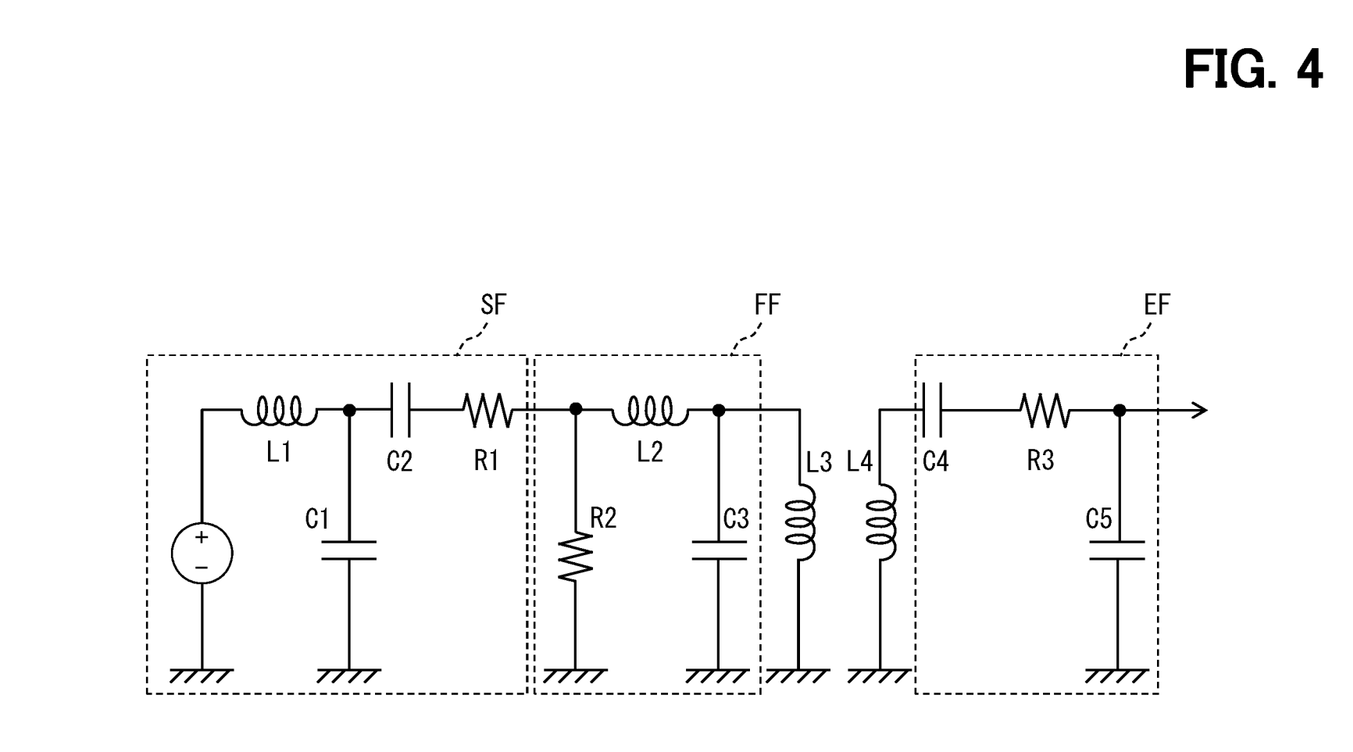
FIG. 4 is a circuit diagram for explaining an equivalent circuit of the MEMS device.

In the conversion of sound into electrical signals, physical phenomena in three different physical fields are related. These three physical phenomena are represented by differential equations. These three differential equations can be expressed by an equivalent circuit. FIG. 4 shows an equivalent circuit of differential equations representing these three different physical phenomena.

The easiness of vibration of the air in the opening hole 210a is represented by a sound field SF. The easiness of vibration of the vibrator 220 is represented by a force field FF. The voltage conversion in the vibrator 220 is represented by an electric field EF. These three fields are electrically connected.

As shown in FIG. 4, each of the sound field SF, the force field FF, and the electric field EF includes various parameters such as a reactor, a capacitance, and a resistance. The parameters of the sound field SF include L1, C1, C2, and R1. The parameters of the force field FF include L2, C3, and R2. The parameters of the electric field EF include C4, C5 and R3.

Of these sound field SF, force field FF, and electric field EF, the parameters of the force field FF are likely to change depending on the temperature and the like. Therefore, as will be described later, the ASIC 300 calculates a correction value for correcting the first electric signal output from the MEMS device 200 based on the parameters of the force field FF. In the following, the parameters of the force field FF are referred to as force field parameters for the sake of simplicity.

<Detection Sensitivity>

Figure 5:
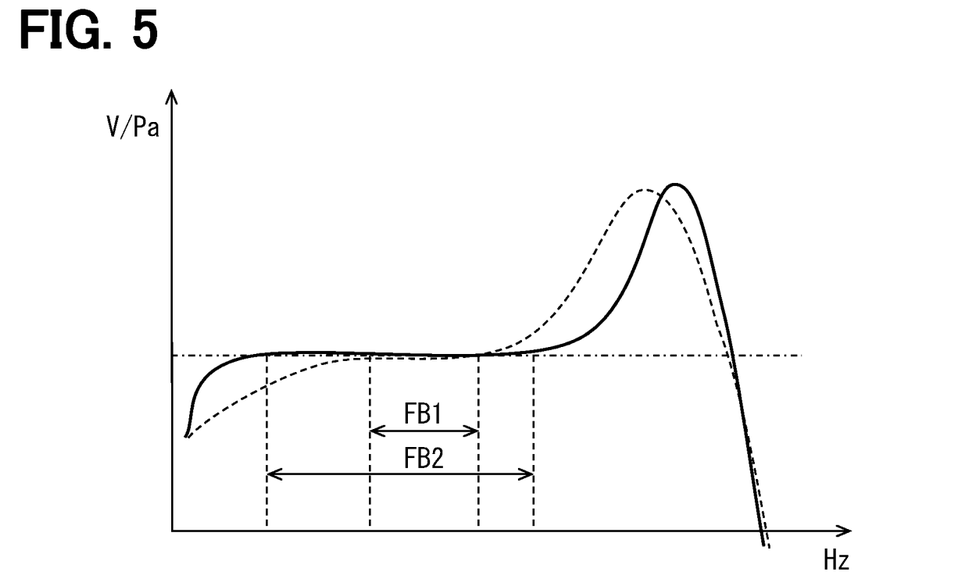
FIG. 5 is a graph showing a sensitivity frequency characteristics of the MEMS device.

The detection sensitivity of the MEMS device 200 to the acoustic pressure can be expressed by the voltage generated with respect to the acoustic pressure. FIG. 5 shows the frequency dependence (sensitivity frequency characteristic) of the detection sensitivity. A vertical axis of FIG. 5 shows the detection sensitivity. A horizontal axis shows the frequency. A unit of the vertical axis is V/Pa. A unit on the horizontal axis is Hz. The detection sensitivity gradually increases in the low frequency region, becomes constant without changing with frequency, and then gradually increases in the high frequency region.

In FIG. 5, an ideal sensitivity frequency characteristic (desired sensitivity frequency characteristic) is shown by a solid line. The uncorrected sensitivity frequency characteristics is shown by the broken line. By the above-mentioned correction, the sensitivity in the low frequency region of the sensitivity frequency characteristic shown by the broken line is amplified. The sensitivity of the sensitivity frequency characteristic in the high frequency range is attenuated.

Due to the correction, the region where the detection sensitivity changes with frequency is narrowed. The frequency band whose detection sensitivity does not depend on the frequency is brought closer from the first frequency band FB1 to the second frequency band FB2. The sensitivity frequency characteristic is brought closer to the desired sensitivity frequency characteristic. The expansion of the frequency band is performed in the ASIC 300.

The ASIC 300 may perform a correction different from the expansion of the frequency band. The ASIC 300 may, for example, amplify or attenuate the sensitivity of a specific frequency band.

<ASIC>

Figure 6:
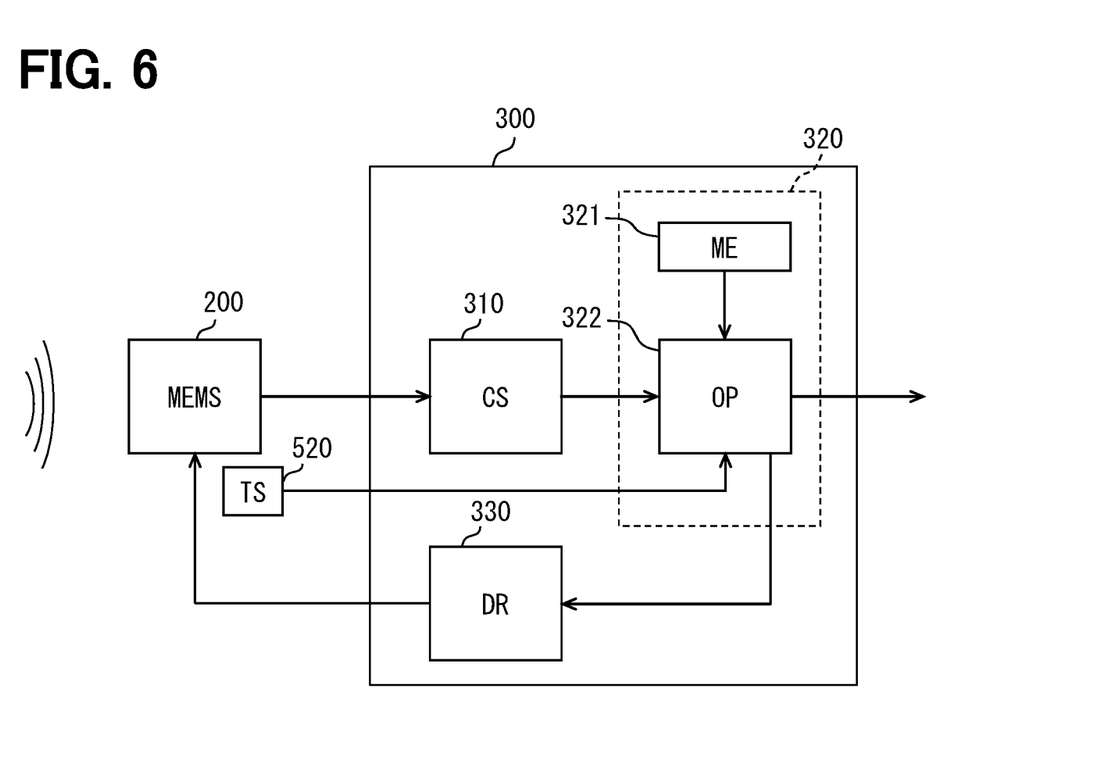
FIG. 6 is a block diagram for explaining the piezoelectric MEMS microphone.

As shown in FIG. 6, the ASIC 300 has a conversion unit 310, a control unit 320, and a driver 330. In the drawing, the conversion unit 310 is referred to as CS. The driver 330 is referred to as DR. Each component of the ASIC 300 executes the correction process and the correction value calculation process shown below.

<Correction Process>

The conversion unit 310 converts a first electric signal indicating a capacitance change or charge change of the capacitor output from the MEMS device 200 vibrating due to acoustic pressure into a voltage. Then, the conversion unit 310 outputs the converted first electric signal (sound collection signal) to the control unit 320.

The control unit 320 makes corrections for expanding the frequency band of the sound collection signal output from the conversion unit 310. Then, the control unit 320 outputs the corrected sound collection signal to a speaker or the like.

<Correction Value Calculation Process>

The control unit 320 outputs a vibration signal for forcibly vibrating the MEMS device 200 to the driver 330. The vibration signal is a pulse signal whose voltage level periodically changes between a high level and a low level. The amplitude of the vibration signal is constant. The high level is, for example, +2.5V. The low level is, for example, −2.5V. The frequency of the vibration signal is invariant. The frequency of the drive signal may change.

The driver 330 amplifies the input vibration signal. Then, the driver 330 outputs the amplified vibration signal (drive signal) to the vibrator 220 of the MEMS device 200. When the drive signal is input to the vibration region VA of the vibrator 220, the vibrator 220 periodically generates a pressure whose action direction changes in the z direction. As a result, the vibrator 220 vibrates in the z direction. The driver 330 does not have to amplify the vibration signal. For example, the driver 330 may be a voltage follower circuit having a degree of amplification of 1. The driver 330 corresponds to the drive unit.

The conversion unit 310 converts a second electric signal indicating a capacitance change or charge change of the capacitor output from the MEMS device 200 vibrating due to the drive signal into a voltage. Then, the conversion unit 310 outputs the converted second electric signal (reference signal) to the control unit 320.

The control unit 320 calculates a correction value for expanding the frequency band of the sound collection signal by using the reference signal output from the conversion unit 310.

<Control Unit>

As shown in FIG. 6, the control unit 320 has a storage part 321 and a calculation part 322. In the drawing, the storage part 321 is referred to as ME. The calculation part 322 is referred to as OP. The control unit 320 corresponds to the correction unit.

The storage part 321 is a non-transitional substantive storage medium that non-temporarily stores data and programs that can be read by a computer or a processor. The storage part 321 has a volatile memory and a non-volatile memory. The storage part 321 stores various input information and the process result of the calculation part 322. The storage part 321 stores various programs and various reference values for the calculation part 322 to perform calculation process.

The calculation part 322 includes a processor. The calculation part 322 stores the input information in the storage part 321. The calculation part 322 executes various calculation processes based on the information stored in the storage part 321.

<Correction Value Calculation Process>

Figure 7:
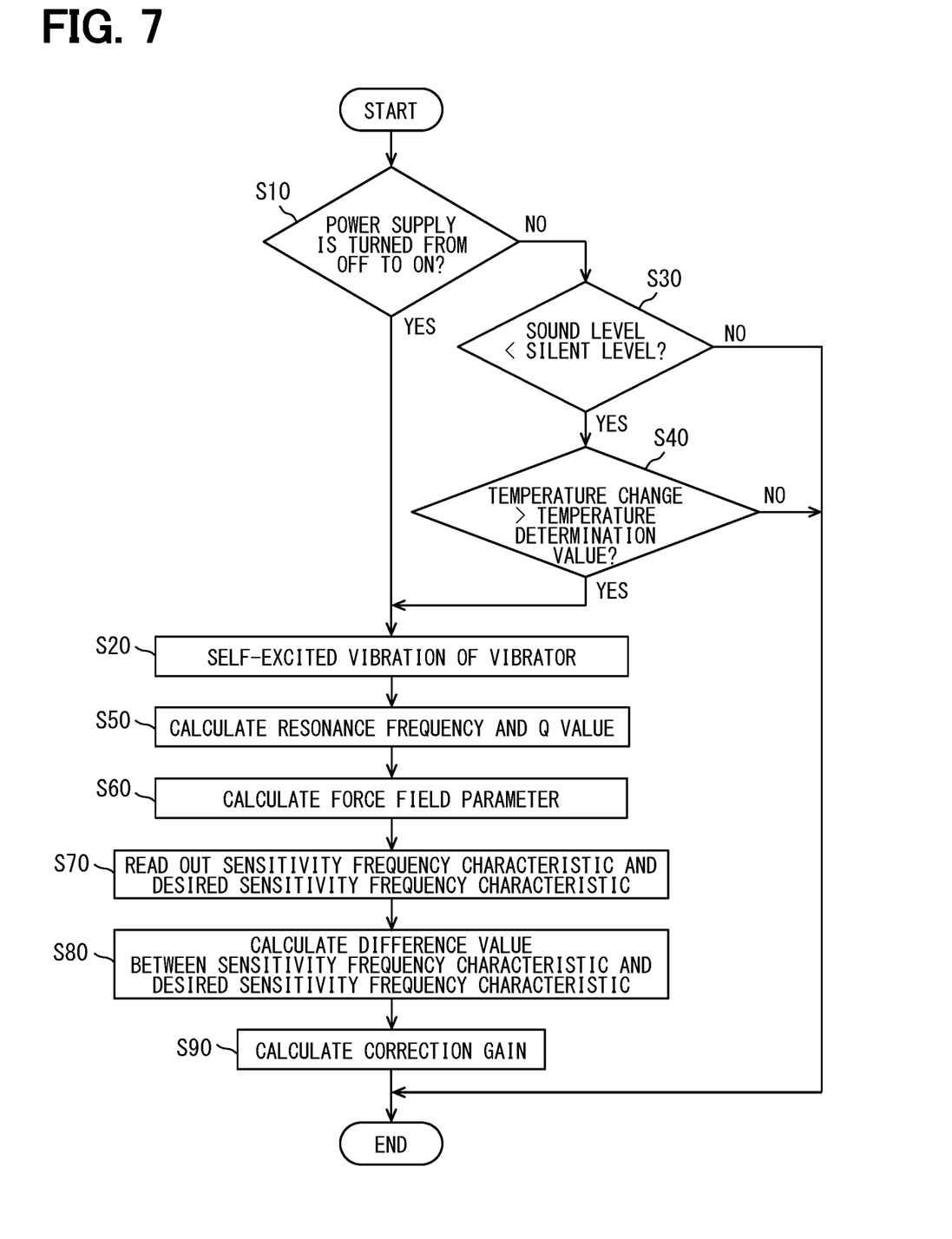
FIG. 7 is a flowchart showing a correction value calculation process.

Next, a correction value calculation process will be described in detail. FIG. 7 shows a process executed by the calculation part 322 in the correction value calculation process. The calculation part 322 performs the correction value calculation process by a cycle task.

In step S10, the calculation part 322 determines whether or not a power supply for supplying power to the piezoelectric MEMS microphone 100 is turned from off to on. When the power supply is turned from off to on, the calculation part 322 proceeds to step S20. When the power supply is in the on state or the off state, the calculation part 322 proceeds to step S30.

When the piezoelectric MEMS microphone 100 is mounted on a vehicle, the calculation part 322 may determine in step S10 whether or not the ignition switch of the vehicle is turned from off to on. When the ignition switch is turned from off to on, the calculation part 322 proceeds to step S20. If the ignition switch is not turned on from off, the calculation part 322 proceeds to step S30.

Further, the calculation part 322 may determine in step S10 whether or not the power source of the vehicle is changed from off to on. When the power source is turned from off to on, the calculation part 322 proceeds to step S20. If the power source is not turned on from off, the calculation part 322 proceeds to step S30.

Further, for example, the calculation part 322 does not have to execute step S10. In this case, the calculation part 322 executes the process of step S30 at the beginning of the correction value calculation process.

When the process proceeds to step S30, the calculation part 322 acquires a sound collection signal. Then, the calculation part 322 detects the loudness (sound level) of the sound in the external environment based on the sound collection signal. The calculation part 322 determines whether or not the sound level is lower than a silent level stored as a reference value in the storage part 321.

When the sound level is lower than the silent level, it is expected that the vibration of the vibrator 220 due to the sound of the external environment does not affect the correction value. In this case, the calculation part 322 proceeds to step S40.

When the sound level is higher than the silent level, it is assumed that the vibration of the vibrator 220 due to the sound of the external environment affects the correction value. In this case, the calculation part 322 ends the correction value calculation process.

When the process proceeds to step S40, the calculation part 322 acquires a temperature from a physical quantity sensor 520 provided in the MEMS device 200. Then, the calculation part 322 stores this temperature in the storage part 321. The calculation part 322 repeatedly executes the correction value calculation process as a cycle task. Therefore, a plurality of temperatures detected at different times are stored in the calculation part 322. The calculation part 322 calculates a temperature change of the MEMS device 200 based on the latest acquired temperature and the past temperature stored in the storage part 321.

The past temperature used for calculating this temperature change is, for example, the temperature at the time of calculating the correction value stored in the storage part 321 at the time of this process. The force field parameters of the MEMS device 200 are temperature dependent. Therefore, if there is a significant change of, for example, about 10° C. from the temperature at which the correction value is calculated, it is assumed that the sensitivity frequency characteristic has changed. Conversely, if there is no significant change from the temperature when the correction value is calculated, it is expected that the sensitivity frequency characteristics have not changed. As the past temperature used for calculating the temperature change, for example, the temperature when the power supply is switched from on to off or from off to on, the temperature before the expected time lapse of the temperature change, and the like can be adopted.

In step S40, the calculation part 322 determines whether or not the calculated temperature change is larger than the temperature determination value stored as the reference value in the storage part 321. When the temperature change is larger than the temperature determination value, the calculation part 322 proceeds to step S20. When the temperature change is lower than the temperature determination value, the calculation part 322 ends the correction value calculation process.

The process order of steps S30 and S40 is not particularly limited. The process order of step S30 and step S40 may be reversed.

When the process proceeds to step S20 through only step S10 or through steps S30 and S40, the calculation part 322 outputs a vibration signal to the driver 330. Then, the drive signal is output from the driver 330 to the MEMS device 200. As a result, the vibrator 220 is forcibly vibrated. The vibrator 220 performs a self-excited vibration. After this process, the calculation part 322 proceeds to step S50.

When the process proceeds to step S50, the calculation part 322 determines whether or not a predetermined time has elapsed since the vibration signal was output. When the predetermined time has elapsed, the calculation part 322 determines that the vibration of the vibrator 220 is stable. The calculation part 322 stops the output of the vibration signal. By doing so, the vibration of the vibrator 220 is attenuated. The calculation part 322 acquires a behavior at the time of attenuating of the vibration as a reference signal. The control unit 320 calculates a resonance frequency and a Q value of the vibrator 220 from the behavior of this reference signal. After this process, the calculation part 322 proceeds to step S60.

In step S50, the calculation part 322 may gradually change the frequency of the vibration signal output to the driver 330 from a low frequency to a high frequency over time. As a result, the vibration of the vibrator 220 changes. The calculation part 322 acquires the behavior at the time of the change of the vibration as a reference signal. The vibrator 220 may calculate the resonance frequency and the Q value of the vibrator 220 from this reference signal.

When the process proceeds to step S60, the calculation part 322 calculates the force field parameter based on the calculated resonance frequency and Q value, and the equivalent circuit shown in FIG. 4. In the calculation process, the calculation part 322 sets various parameters of the sound field SF and the electric field EF as fixed values. After calculating the force field parameter, the calculation part 322 proceeds to step S70.

When the process proceeds to step S70, the calculation part 322 reads out the sensitivity frequency characteristics corresponding to the calculated force field parameters from the storage part 321. At the same time, the calculation part 322 reads out the desired sensitivity frequency characteristic from the storage part 321. In step S70, the calculation part 322 reads out, for example, the desired sensitivity frequency characteristic shown by the solid line in FIG. 5 and the sensitivity frequency characteristic shown by the broken line in FIG. 5 from the storage part 321.

Figure 8:
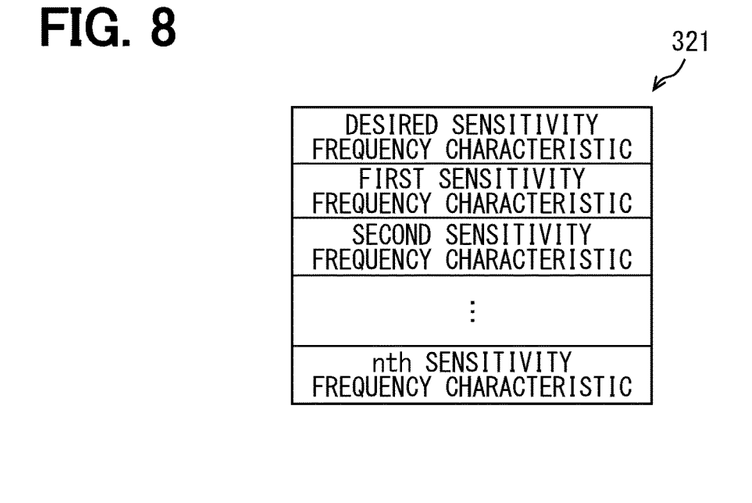
FIG. 8 is a schematic diagram showing sensitivity frequency characteristics stored in a storage unit.

As shown in FIG. 8, the storage part 321 stores the desired sensitivity frequency characteristic including an ideal frequency band as a reference value. The storage part 321 stores a first sensitivity frequency characteristic to a nth sensitivity frequency characteristic corresponding to the force field parameter as reference values. n is an integer of 2 or more. In the storage part 321, a relationship between the force field parameter and the sensitivity frequency characteristic is stored. In FIG. 8, the force field parameters are not shown. The force field parameter depends on the temperature. Therefore, the relationship between the first sensitivity frequency characteristic and the nth sensitivity frequency characteristic with respect to the temperature may be stored in the storage part 321.

When the process proceeds from step S70 to step S80, the calculation part 322 calculates a difference value obtained by subtracting the read out sensitivity frequency characteristic and the desired sensitivity frequency characteristic. The calculation part 322 calculates the difference value of each frequency characteristic. After this process, the calculation part 322 proceeds to step S90.

When the process proceeds to step S90, the calculation part 322 calculates a correction value (correction gain) for reducing the difference value of each frequency characteristic. The calculation part 322 stores this correction gain in the storage part 321. After this process, the calculation part 322 ends the correction value calculation process.

<Correction Process Flow>

Figure 9:
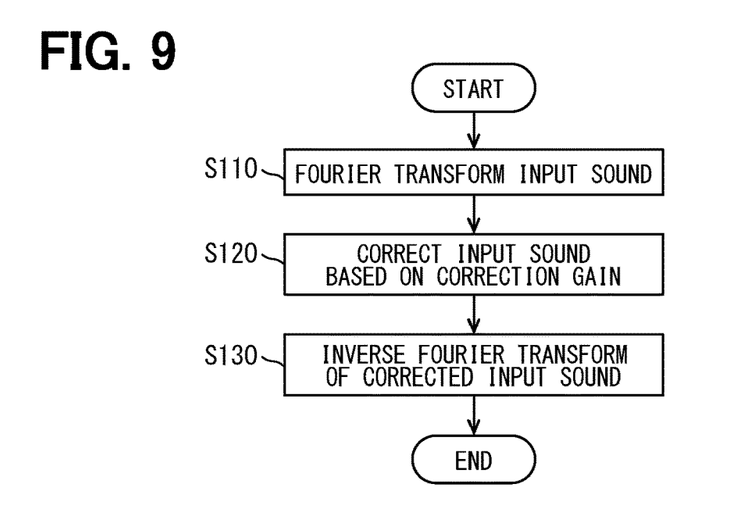
FIG. 9 is a flowchart showing a correction process.

Next, the correction process will be described in detail. FIG. 9 shows a process executed by the calculation part 322 in a correction process. The calculation part 322 performs the correction process every time the sound collection signal (input voice) is input. That is, the calculation part 322 constantly performs the correction process when using the piezoelectric MEMS microphone 100.

In step S110, the calculation part 322 Fourier transforms the sound collection signal input from the conversion unit 310. The calculation part 322 decomposes the sound collection signal into waves having a plurality of frequencies. After this process, the calculation part 322 proceeds to step S120.

When the process proceeds to step S120, the calculation part 322 multiplies each of the waves of a plurality of frequencies included in the sound collection signal by the correction gain of each frequency. By doing this process, each wave of a plurality of frequencies is corrected. After this process, the calculation part 322 proceeds to step S130.

When the process proceeds to step S130, the calculation part 322 returns the corrected multiple frequency waves to one sound collection signal by the inverse Fourier transform. Then, the calculation part 322 outputs the corrected sound collection signal to the speaker or the like.

<Effects>

As described above, the calculation part 322 performs the self-excited vibration of the vibrator 220 by the vibration signal. Then, the calculation part 322 calculates a correction value (correction gain) for correcting the sound collection signal by using the reference signal input from the conversion unit 310 at the time of self-excited vibration of the vibrator 220.

In this way, the correction value can be calculated even if there is no sound source. The correction value does not depend on the characteristics of the sound source.

The calculation part 322 calculates the correction value when the sound level of the external environment is lower than the silent level. According to this configuration, it is suppressed to calculate an inaccurate correction value due to the sound (acoustic pressure) of the external environment. It is suppressed that the correction of the sound collection signal is improper.

The calculation part 322 calculates the correction value when the amount of temperature change of the vibrator 220 is larger than the temperature determination value. In other words, the calculation part 322 stops calculating the correction value when the temperature change amount of the vibrator 220 is equal to or less than the temperature determination value. According to this configuration, the process load of the calculation part 322 is reduced.

One vibrator 220 includes the detection region DA and the vibration region VA. According to this configuration, the increase in the physique of the MEMS device 200 is suppressed.

The detection region DA is located on the center side of one vibrator 220, and the vibration region VA is located on the end side of the vibrator 220. According to this configuration, even if warp or bending occurs due to a temperature change or the like on the edge side including the hypotenuse 220b, it is difficult for the capacitance change or the charge change to occur in the detection region DA. It is suppressed that the detection accuracy of the acoustic pressure is lowered due to the warp or bending of the edge side including the hypotenuse 220b.

Second Embodiment

Next, a second embodiment will be described with reference to FIGS. 10 and 11.

In the first embodiment, an example is shown in which the desired sensitivity frequency characteristic and the relationship between the force field parameter and the sensitivity frequency characteristic are stored in the storage part 321. On the other hand, in the present embodiment, the desired parameter, and the relationship between the difference value between the desired parameter and the force field parameter, and the correction gain are stored in the storage part 321.

Figure 10:
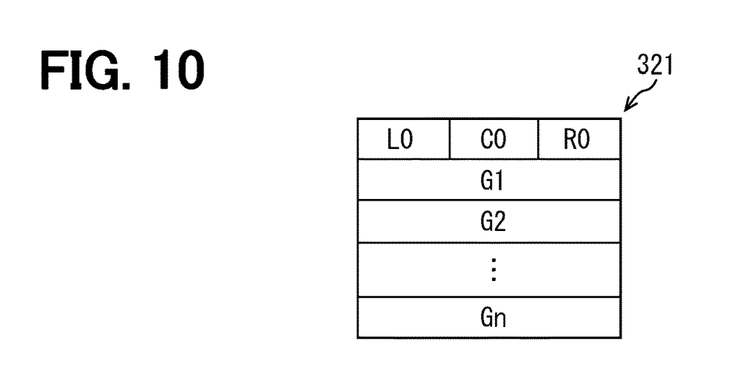
FIG. 10 is a schematic diagram for explaining a correction value stored in a storage unit.

In FIG. 10, the reactance, capacitance, and resistance included in the desired force field parameters are expressed as L0, C0, and R0. The correction gain corresponding to the difference value between the desired force field parameter and the actual force field parameter is expressed as G1 . . . Gn. The desired force field parameter is a force field parameter at the time of the desired sensitivity frequency characteristic. In FIG. 10, the difference value is not shown. The relationship of the correction gain with respect to the temperature may be stored in the storage part 321.

Figure 11:
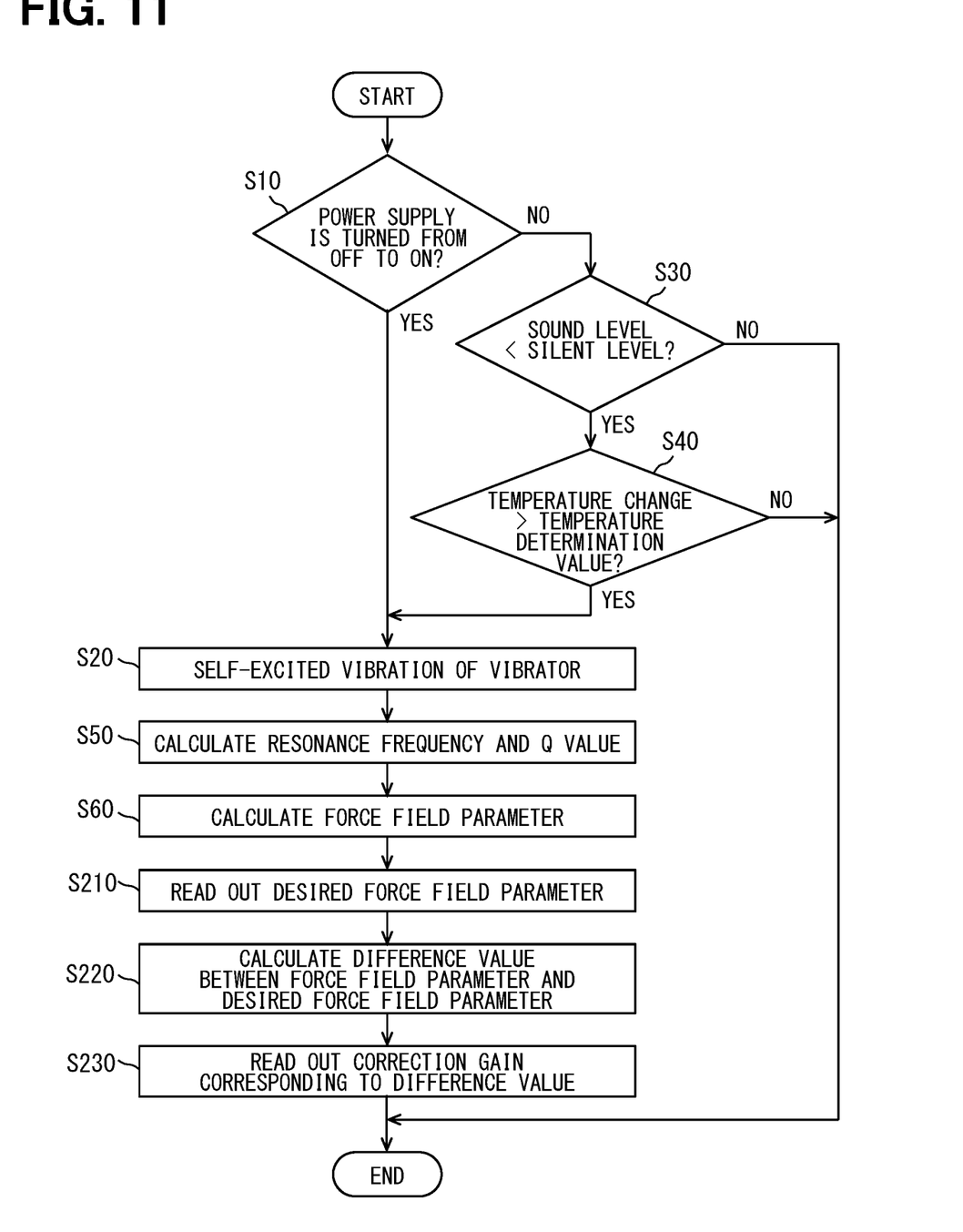
FIG. 11 is a flowchart showing a correction value calculation process.

The calculation part 322 of the present embodiment executes the correction value calculation process shown in FIG. 11 instead of the correction value calculation process shown in FIG. 7. The difference between the correction value calculation process shown in FIG. 7 and the correction value calculation process shown in FIG. 11 is the processes after step S60.

After calculating the force field parameter in step S60, the calculation part 322 proceeds to step S210.

When the process proceeds to step S210, the calculation part 322 reads out the desired force field parameter from the storage part 321. After this process, the calculation part 322 proceeds to step S220.

When the process proceeds to step S220, the calculation part 322 calculates a difference value obtained by subtracting the calculated force field parameter and the read out desired force field parameter. After this process, the calculation part 322 proceeds to step S230.

When the process proceeds to step S230, the calculation part 322 reads out the correction value (correction gain) corresponding to the calculated difference value from the storage part 321. After this process, the calculation part 322 ends the correction value calculation process.

The piezoelectric MEMS microphone 100 described in the present embodiment includes components equivalent to those of the piezoelectric MEMS microphone 100 described in the first embodiment. Therefore, the piezoelectric MEMS microphone 100 of the present embodiment has the same effect as the piezoelectric MEMS microphone 100 described in the first embodiment. Therefore, the description regarding the effect is omitted. Also in the other embodiments and modifications shown below, the description of overlapping effects will be omitted.

Third Embodiment

Next, a third embodiment will be described with reference to FIGS. 12 and 13.

In the first embodiment, an example is shown in which the vibrator 220 included in the MEMS device 200 has the detection region DA and the vibration region VA, respectively. On the other hand, in the present embodiment, the MEMS device 200 has a first MEMS device 201 and a second MEMS device 202.

Figure 13:
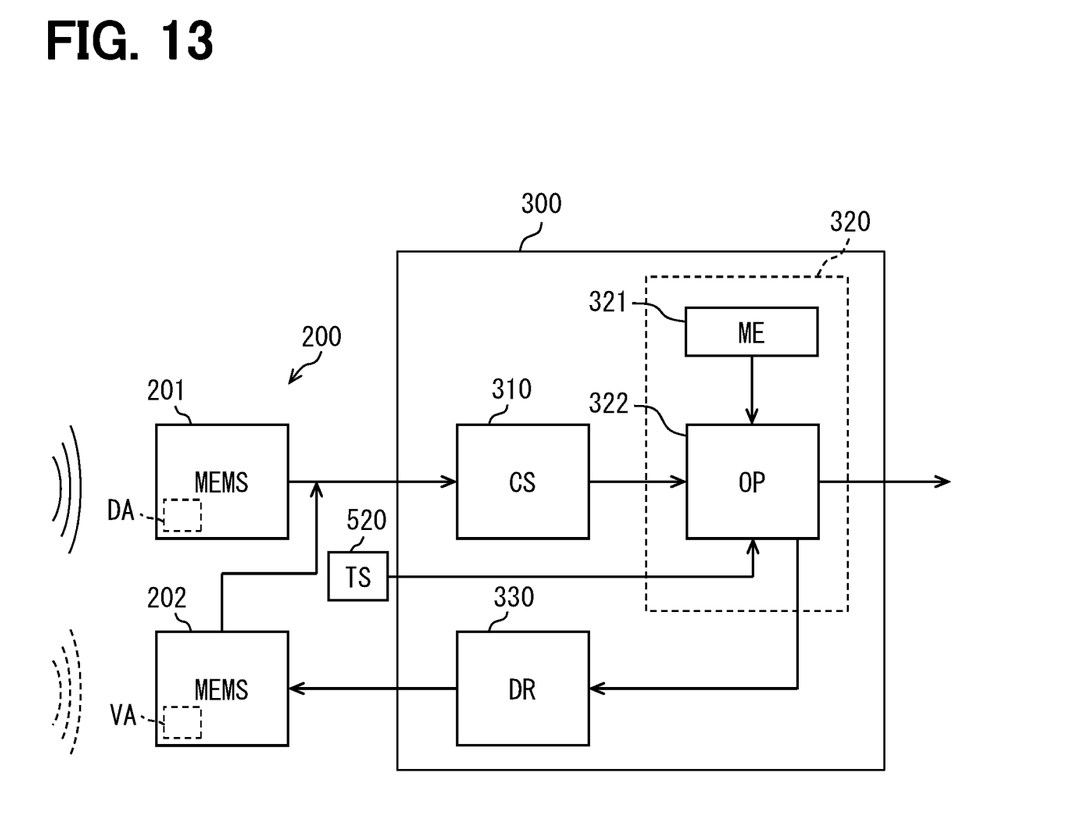
FIG. 13 is a block diagram showing a piezoelectric MEMS microphone.

In FIG. 13, as schematically shown by being surrounded by a broken line, the vibrator 220 included in the first MEMS device 201 has only the detection region DA out of the detection region DA and the vibration region VA. The vibrator 220 included in the second MEMS device 202 has only the vibration region VA out of the detection region DA and the vibration region VA.

Each of the first MEMS device 201 and the second MEMS device 202 is formed by microfabrication of a semiconductor chip taken out from the same ingot. Therefore, the first MEMS device 201 and the second MEMS device 202 have the same physical properties. The basic configurations of each of the first MEMS device 201 and the second MEMS device 202 are the same as the basic configurations of the MEMS device 200 described in the first embodiment, although there is a difference between the presence or absence of the detection region DA and the vibration region VA described above.

Figure 12:
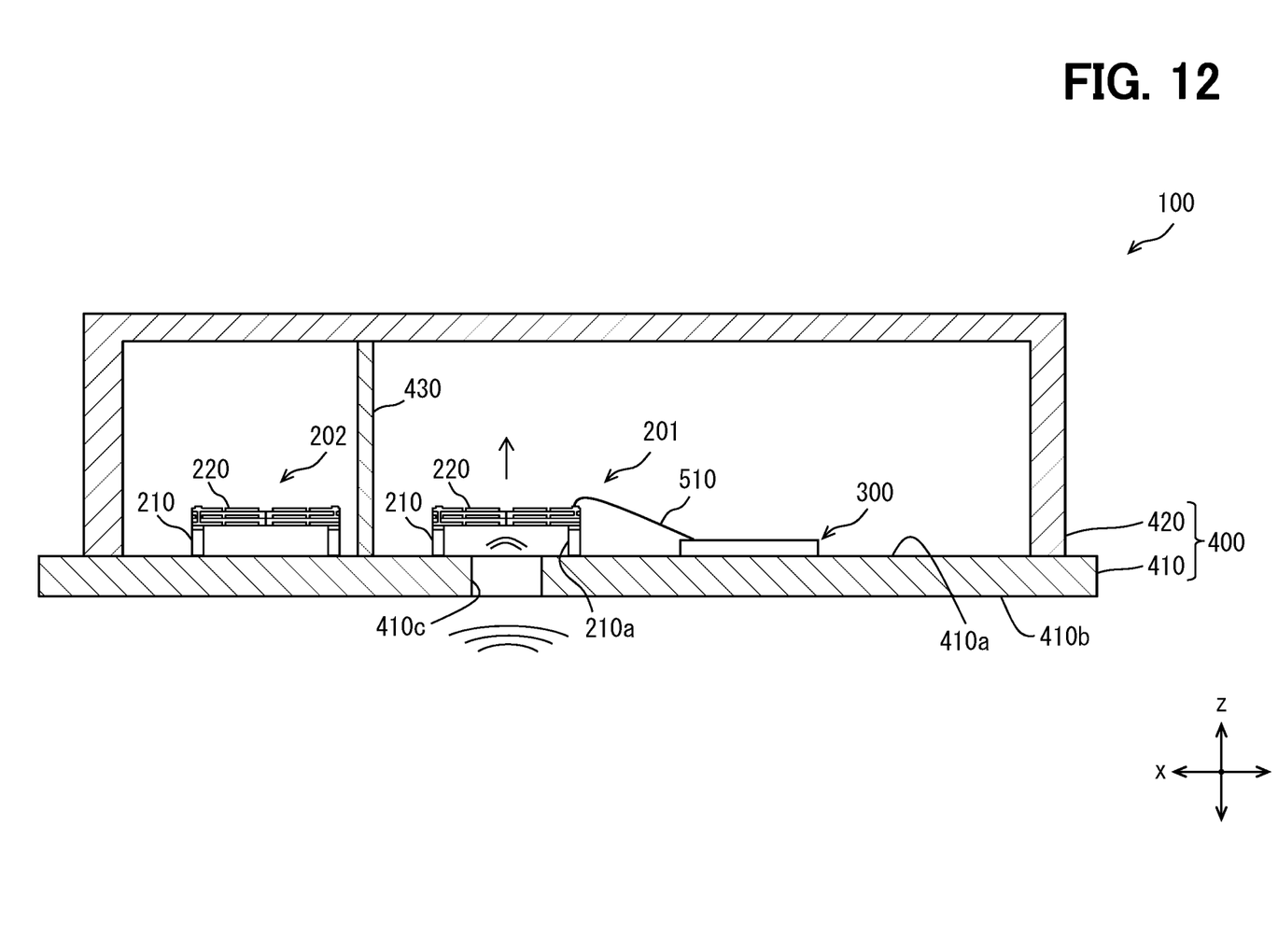
FIG. 12 is a sectional view showing a piezoelectric MEMS microphone.

As shown in FIG. 12, the package 400 has a partition wall 430 in addition to the substrate 410 and the lid 420. The internal space of the package 400 composed of the substrate 410 and the lid 420 is separated into a first internal space and a second internal space by the partition wall 430. The first internal space and the second internal space are not in communication with each other.

The package 400 corresponds to a storage portion. The first internal space corresponds to a detection space. The second internal space corresponds to an inspection space.

The introduction hole 410c is open on the inner surface 410a of the substrate 410 and at a portion that partitions the first internal space. Therefore, the introduction hole 410c communicates the first internal space with the external space. The introduction hole 410c does not communicate the second internal space with the external space. The second interior space is isolated from the exterior space. The second internal space and the external space are not communicated with each other.

Due to the configuration shown above, the air in the first internal space is likely to vibrate due to the sound generated in the external space. The sound generated in the external space makes it difficult for the air in the second internal space to vibrate. The first MEMS device 201 is provided in this first internal space. The second MEMS device 202 is provided in the second internal space.

Due to this arrangement configuration, the vibrator 220 included in the first MEMS device 201 is likely to vibrate due to the sound generated in the external space. The vibrator 220 included in the second MEMS device 202 is less likely to vibrate due to the sound generated in the external space.

Therefore, even if the sound level of the external environment is higher than the silent level, the correction gain can be calculated by forcibly vibrating the second MEMS device 202. In the case of the present embodiment, for example, step S30 shown in FIGS. 7 and 11 can be omitted.

First Modification

In the first embodiment, the example in which one MEMS device 200 is mounted on the substrate 410 is shown. However, an array microphone may be configured by mounting a plurality of MEMS devices 200 on the substrate 410.

Second Modification

In each embodiment, the example is shown in which the calculation part 322 performs the correction value calculation process by a cycle task. Then, in step S10 of the correction value calculation process, when the power supply is in on-state or off-state, the calculation part 322 shows the example of proceeding to step S30. Before proceeding to step S30, the calculation part 322 may determine whether the power is in on-state or off-state.

When the power is in on-state, it is assumed that the piezoelectric MEMS microphone 100 is in use and the sound level of the external environment is higher than the silent level. Therefore, in this case, the calculation part 322 may determine to lengthen a cycle of the correction value calculation process cycle.

When the power is in off-state, the piezoelectric MEMS microphone 100 is not in use, and it is expected that the sound level of the external environment is lower than the silent level. Therefore, in this case, the calculation part 322 may determine to shorten a cycle of the correction value calculation process cycle.

Further, it is difficult to assume that the physical parameters of the MEMS device 200 will change immediately after the correction value is calculated. Therefore, the calculation part 322 may not newly execute the correction value calculation process unless a predetermined time has elapsed after the correction value is calculated. According to this configuration, the process load of the calculation part 322 is reduced.

Third Modification

In each embodiment, an example is shown in which the calculation part 322 proceeds to step S20 when the power is turned on from off in step S10 of the correction value calculation process. In this case, the calculation part 322 calculates the correction value regardless of the sound level of the external environment. Therefore, this correction value may be inappropriate. When the process of step S20 is executed only through step S10 in this way, the calculation part 322 may compare the calculated correction value with the correction value stored in the storage part 321. When the difference between the calculated correction value and the correction value exceeds the threshold value stored as the reference value in the storage part 321, the calculation part 322 may determine that the calculated correction value is inappropriate.

Other Modifications

In each embodiment, the example in which a gap is formed between the plurality of vibrators 220 is shown. However, a specified portion may be supported by the support base 210 together with the vibrator 220. Then, a gap may be formed between this specified portion and the vibrator 220.

In each embodiment, an example is shown in which the vibrator 220 forms a tapered triangle. However, the shape of the vibrator 220 is not particularly limited. For example, the vibrator 220 may form a rectangle.

In each embodiment, an example in which the number of vibrators 220 is 4 is shown. However, the number of vibrators 220 is not particularly limited. The number of vibrators 220 may be singular.

Although the present disclosure has been described in accordance with the examples, it is understood that the present disclosure is not limited to such examples or structures. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A microphone, comprising:
    a vibration device configured to output a first electric signal according to an acoustic pressure;
    a drive unit configured to vibrate the vibration device by a drive signal; and
    a correction unit configured to calculate a correction value for correcting the first electric signal based on a second electric signal output from the vibration device when the vibration device is vibrated by the drive signal, wherein
    the second electric signal is not based on an acoustic signal.

2. The microphone according to claim 1, wherein
    the correction unit has a calculation part configured to calculate parameters of an equivalent circuit indicating a characteristics of the vibration device from the second electric signal.

3. The microphone according to claim 2, wherein
    the correction unit has a storage part in which a relationship between the parameter and a sensitivity frequency characteristic of the vibration device and a desired sensitivity frequency characteristic of the vibration device are stored, and
    the calculation part reads out each of the sensitivity frequency characteristic and the desired sensitivity frequency characteristic corresponding to the calculated parameter from the storage part, and calculates the correction value based on a difference value between the sensitivity frequency characteristic and the desired sensitivity frequency characteristic read out.

4. The microphone according to claim 2, wherein
    the correction unit has a storage part in which a desired parameter of the equivalent circuit and a correction value corresponding to a difference value between the parameter and the desired parameter are stored, and
    the calculation part reads the desired parameter from the storage part, calculates the difference value based on the calculated parameter and the read out desired parameter, and reads out the correction value corresponding to the difference value from the storage part.

5. The microphone according to claim 1, wherein
    the drive unit outputs the drive signal to the vibration device when a sound level indicated by the first electric signal is lower than a silent level.

6. The microphone according to claim 1, wherein
    the drive unit outputs the drive signal to the vibration device when an amount of change in temperature of the vibration device is larger than a temperature determination value.

7. The microphone according to claim 1, wherein
    the vibration device has a vibrator configured to output the first electric signal corresponding to the acoustic pressure and output the second electric signal when vibrated by the drive signal.

8. The microphone according to claim 1, wherein
    the vibration device has a first detection unit that outputs the first electric signal corresponding to the acoustic pressure, and a second detection unit that is vibrated by the drive signal.

9. The microphone according to claim 8, wherein
    the vibration device has a vibrator including each of the first detection unit and the second detection unit.

10. The microphone according to claim 8, further comprising,
    a storage portion having
        a detection space that is in communication with an external space and
        an inspection space that is not in communication with each of the external space and the detection space, wherein
    the first detection unit is provided in the detection space, and
    the second detection unit is provided in the inspection space.

11. The microphone according to claim 1, wherein
    the vibration device contains a piezoelectric material having a higher piezoelectric constant than aluminum nitride.

12. A microphone, comprising:
    a vibration device configured to output a first electric signal according to an acoustic pressure;
    a drive unit configured to vibrate the vibration device by a drive signal; and
    a correction unit configured to calculate a correction value for correcting the first electric signal based on a second electric signal output from the vibration device when the vibration device is vibrated by the drive signal, wherein
    the correction unit has a calculation part configured to calculate parameters of an equivalent circuit indicating a characteristics of the vibration device from the second electric signal.

13. A microphone, comprising:
    a vibration device configured to output a first electric signal according to an acoustic pressure;
    a drive unit configured to vibrate the vibration device by a drive signal; and
    a correction unit configured to calculate a correction value for correcting the first electric signal based on a second electric signal output from the vibration device when the vibration device is vibrated by the drive signal, wherein
    the drive unit outputs the drive signal to the vibration device when an amount of change in temperature of the vibration device is larger than a temperature determination value.

* * * * *